United States Patent
Seeley et al.

(10) Patent No.: US 9,303,858 B2
(45) Date of Patent: Apr. 5, 2016

(54) SYSTEM FOR COOLING DEVICES

(71) Applicant: General Electric Company, Schenectady, NY (US)

(72) Inventors: Charles Erklin Seeley, Niskayuna, NY (US); Stanton Earl Weaver, Jr., Broadalbin, NY (US); Brian Magann Rush, Niskayuna, NY (US); Mark Howard Giammattei, Selkirk, NY (US)

(73) Assignee: General Electric Company, Niskayuna, NY (US)

( * ) Notice: Subject to any disclaimer, the term of this patent is extended or adjusted under 35 U.S.C. 154(b) by 252 days.

(21) Appl. No.: 13/779,822

(22) Filed: Feb. 28, 2013

(65) Prior Publication Data

US 2014/0240993 A1    Aug. 28, 2014

(51) Int. Cl.
*B60Q 1/06*        (2006.01)
*F21V 29/00*      (2015.01)
(Continued)

(52) U.S. Cl.
CPC ............... *F21V 29/30* (2013.01); *F04B 43/046* (2013.01); *F04B 43/095* (2013.01); *F04B 45/027* (2013.01); *F21V 29/63* (2015.01); *H01L 23/467* (2013.01); *H01L 2924/0002* (2013.01)

(58) Field of Classification Search
CPC ....... F21V 29/02; F21V 29/402; F21V 29/40; F21V 29/004; F21V 29/002; F21V 29/63; F21V 29/30; F15D 1/00; F15D 1/08; F15D 1/025; F04B 43/046; F04B 43/095; F04B 45/027; H01L 23/467
USPC .......... 362/373, 547, 218, 264, 294; 313/151, 313/11, 13
See application file for complete search history.

(56) References Cited

U.S. PATENT DOCUMENTS 7,688,583 B1   3/2010  Arik et al.
8,006,917 B2   8/2011  Arik et al.
(Continued)

FOREIGN PATENT DOCUMENTS

EP       2336577 A2    6/2011
JP       H03168373 A   7/1991
(Continued)

OTHER PUBLICATIONS

EP Search Report and Written Opinion issued Jun. 4, 2014 in connection with corresponding EP Patent Application No. 14156421.1.
(Continued)

*Primary Examiner* — Nimeshkumar Patel
*Assistant Examiner* — Kevin Quarterman
(74) *Attorney, Agent, or Firm* — Jason K. Klindtworth

(57) ABSTRACT

A cooling system is provided. The cooling system includes an enclosure. The enclosure is defined by walls among which at least one is movable. The enclosure further includes at least one aperture on at least one wall. The system further includes an amplification element that is coupled with at least one walls of the enclosure. Further, the cooling system includes an actuation unit mechanically coupled with the amplification element. The actuation unit includes at least one actuation signal triggered actuator configured to cause a displacement the amplification element. In the cooling system, the amplification element is configured to amplify the actuator caused displacement through to the at least one wall of the enclosure such that fluid enters and exits the enclosure from the at least one aperture.

17 Claims, 4 Drawing Sheets

(51) Int. Cl.
*F04B 43/04* (2006.01)
*H01L 23/467* (2006.01)
*F04B 43/09* (2006.01)
*F04B 45/027* (2006.01)
*F21V 29/63* (2015.01)

(56) References Cited

U.S. PATENT DOCUMENTS

| | | |
|---|---|---|
| 8,272,851 B2 | 9/2012 | Lucas |
| 2005/0018017 A1* | 1/2005 | Silverbrook ............ 347/54 |
| 2008/0043061 A1 | 2/2008 | Glezer et al. |
| 2008/0174620 A1 | 7/2008 | Tanner |
| 2010/0051242 A1 | 3/2010 | Arik et al. |
| 2010/0051721 A1 | 3/2010 | Arik et al. |
| 2010/0054973 A1 | 3/2010 | Arik et al. |
| 2011/0139893 A1* | 6/2011 | Wetzel et al. ............ 239/102.2 |
| 2011/0204790 A1* | 8/2011 | Arik et al. ............ 315/113 |
| 2011/0316416 A1 | 12/2011 | Han et al. |
| 2012/0051058 A1 | 3/2012 | Sharma et al. |
| 2012/0199667 A1 | 8/2012 | Darbin et al. |
| 2012/0300474 A1 | 11/2012 | Jung et al. |
| 2013/0068427 A1* | 3/2013 | Williams et al. ............ 165/121 |

FOREIGN PATENT DOCUMENTS

| | | |
|---|---|---|
| WO | 2010044047 A1 | 4/2010 |
| WO | 2012052326 A1 | 4/2012 |

OTHER PUBLICATIONS

Zhang et al., "Experimental Study on Flow and Heat Transfer Characteristics of Synthetic Jet Driven by Piezoelectric Actuator", Science in China Series E Technological Sciences, Apr. 2007, vol. 50, Issue 2, pp. 221-229.

* cited by examiner

SYSTEM FOR COOLING DEVICES

BACKGROUND

The present invention relates, generally, to cooling devices, and, specifically, to a system for active cooling of electronic devices.

Electronic devices such as computing systems and lighting systems typically include heat generating elements like integrated circuits (ICs), semiconductor components, electrical connections, and light emitting diodes (LEDs) that lead to device heating. Light emitting diodes, on account of the power provided to them, tend to heat up and dissipate heat to their surroundings. The heat generated in LEDs as well as ICs can lead to significant reduction in the operational efficiency and even deterioration of the devices if not addressed. To avoid these problems, many electronic devices are fitted with cooling devices.

Many electronic devices currently employ electric fans that operate periodically to cool the heat generating elements. The electric fans are typically large and require a large amount of power to aide cooling. The size of electric fans increases the size of the devices and thus leads to increase in weight. Also, energy efficiency of the devices employing fans is reduced to a great extent since the electric fans consume large amount of power. Electric fans also cannot be fitted in small sized electronic devices. Electronic devices also implement coolant based systems that cause a coolant to flow in the proximity of the heat generating elements to draw the heat away from the device. The coolants used in such cooling systems needs to be changed periodically. Moreover, spillage of the coolant on components in the electronic devices may lead to malfunction of the electronic devices.

Manufacturers have sought to solve the problem of electric fans and coolant based systems with the help of synthetic jets. Synthetic jets typically comprise two plates that form a fluid housing. When the plates are moved back and forth from their original position, ambient air enters the fluid housing and also leaves the fluid housing. At least one of the two plates has apertures to allow for fluids to enter and exit the fluid housing. The plates are fitted with linear actuators to cause the back and forth movement of the plates required for entry and exit of fluid. Linear actuators fixed with the plates of synthetic jets typically comprise pistons, motors and similar devices. Piezoelectric transducers are extensively used to generate motion of the plates in synthetic jets owing to their property of converting electric signals to mechanical vibrations. In many current synthetic jets, at least one plate includes a piezoelectric transducer that is connected to a power source. When an electric signal is provided to the piezoelectric transducer, the plate with the transducer moves away from the rest of the jet assembly thereby increasing the volume of the fluid housing. The increase in volume leads to suction of air into the fluid housing through the apertures on the plate. When the electric signal is disconnected or when a rapidly changing alternating electric signal is applied, the piezoelectric transducer returns to its normal position, thus leading to a reduction in volume of the fluid housing. The reduction in volume leads to a release of air from the apertures, which cools the components of the electronic device that are proximate to the synthetic jets. In some synthetic jets, only one of the plates that form the fluid housing is a piezoelectric disc that deforms on application of electric signal.

Piezoelectric transducers or discs, however, only provide limited displacement of the plates and hence lead to very little release of cooling fluid on the components. In current electronic devices that include many heat-producing components, it is necessary to include multiple synthetic jet assemblies to cool all the components. The increase in number of synthetic jets also leads to an increase in the overall size of the electronic device. Further, most of the current piezoelectric transducer based synthetic jets have shown peak efficiency when the frequency of electric signals supplied to the transducer is greater than 100 Hz. To provide electric signals at such frequencies, power conversion electronics need to be employed. However, the power conversion electronics add to the cost of the cooling system and thus to that of the electronic device.

Thus, there is a need for a system that provides greater displacement of the movable plates without increasing the cost of manufacturing synthetic jets significantly.

BRIEF DESCRIPTION

In one embodiment, a cooling system is provided. The cooling system includes an enclosure. The enclosure is defined by walls of which at least one is movable. The enclosure further includes at least one aperture. The system further includes an amplification element that is coupled with at least one of the movable walls of the enclosure. Further, the cooling system includes an actuation unit mechanically coupled with the amplification element. The actuation unit includes at least one actuator configured to cause a displacement of the amplification element. In the cooling system, the amplification element is configured to amplify the actuator displacement through to the at least one movable wall of the enclosure such that fluid enters and exits the enclosure from the at least one aperture.

In another embodiment, a lighting system is provided. The lighting system includes a light source. The light source includes a heat generating element. Further, the lighting system includes a cooling system that is placed proximate to the heat generating element. The system includes an enclosure with at least one aperture disposed in a housing of the lighting system. The enclosure includes at least one wall that is movable. Further, the cooling system includes at least one amplification element that is mechanically coupled with at least one movable wall of the enclosure. The cooling system further includes an actuation unit mechanically coupled with the amplification element. The actuation unit comprises at least one actuator that causes displacement of the amplification element. The amplification element is configured to amplify the actuator displacement through to at least one movable wall of the enclosure such that fluid enters and exits the enclosure from the at least one aperture.

DRAWINGS

The present invention will be better understood from reading the following description of non-limiting embodiments, with reference to the attached drawings, wherein below:

DETAILED DESCRIPTION

Figure 1:
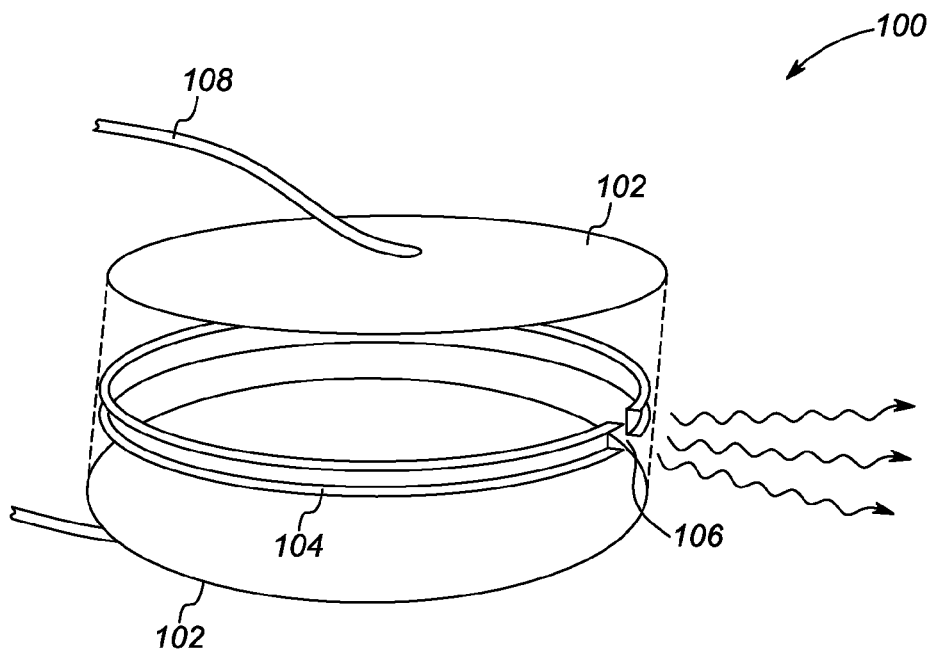
FIG. 1 illustrates a prior art system for cooling devices.

Reference will be made below in detail to exemplary embodiments of the invention, examples of which are illustrated in the accompanying drawings. Wherever possible, the same reference numerals used throughout the drawings refer to the same or like parts.

Embodiments of the invention described herein relate to a system for cooling electronic devices. Electronic devices, such as processing units and lighting systems, include multiple heat generating elements. Heat generating elements in electronic devices include, but are not limited to, integrated circuits (ICs) in processing units, and light sources in lighting systems. During operation, these heat generating elements produce heat that can damage other components in the electronic devices. Further, the heat generated also leads to deterioration of operational efficiency of these devices. The system as described herein may be used to cool electronic devices without significantly adding to the size, weight, and cost of the electronic devices. The cooling system includes an enclosure. The enclosure includes at least one wall that is movable, thereby allowing for a change of volume in the enclosure. Additionally, at least one wall of the enclosure includes at least one aperture to allow for entry and exit of fluid in the aperture. The other walls of the enclosure ensure that the fluid enter and exit the enclosure only through the at least one aperture. The cooling system includes an amplification element that is mechanically coupled with at least one movable wall of the enclosure. The amplification element and the movable wall of the enclosure are loosely coupled such that at least one wall of the enclosure can be displaced from its original position without losing contact with the amplification element. The amplification element is also coupled with an actuation unit that includes an actuator. When actuation signals are provided to the actuator it causes linear motion in the actuator. The linear motion in the actuator leads to displacement of the amplification element. The movement of the amplification element in turn causes movement of at least one movable wall of the enclosure. The amplification element amplifies the displacement of the wall of the enclosure caused by the actuation unit causing an increase in the volume of the enclosure. The increase in volume allows cooling fluid to enter the enclosure from the at least one aperture. When the actuation signal is discontinued or when a polarity of the actuation signal is reversed, the wall of the enclosure returns to its original position and thus reduces the volume of the enclosure. In certain embodiments, the wall moves in an opposite direction thereby further reducing the volume of the enclosure. Due to compression of the enclosure, fluid, for example air, in the enclosure exits from the aperture and impinges on the component that is proximate to the cooling system thereby reducing the temperature of the component. The amplification element may be selected based on an amount of heat dissipated by a particular component in the device. The foregoing is described in greater detail in the subsequent paragraphs with the help of accompanied drawings.

FIG. 1 illustrates a prior art system for cooling electronic devices. The prior art system 100 for cooling devices includes a plurality of plates 102, a flexible wall 104, an orifice 106, and electric connections 108. The plurality of plates 102 are separated from each other with the help of the flexible wall 104. The plates 102 are placed on either sides of the flexible wall 104 to define a fluid housing. To cause the volume of the fluid housing to increase as well as decrease, at least one of the plates 102 is generally displaced. In certain embodiments, the plates 102 are made from piezoelectric material or piezoelectric material bonded to a rigid disc, thereby enabling the plates 102 to be displaced when electric signals are provided. In certain other embodiments, the plates 102 may be formed from materials including plastic, metal, glass or any other known ceramic. In such embodiments, the plates 102 are coupled with linear actuators to enable displacement. Examples of linear actuators include, but are not limited to, piezoelectric actuators, electric actuators, ultrasonic actuators, electro-restrictive actuators, pneumatic actuators, and magnetic actuators. The piezoelectric actuators may be monomorph devices or bimorph devices. The linear actuators are coupled to the plates 102 on that side of the plates 102 that is not coupled with the flexible walls 104. To actuate the plates 102 made from piezoelectric material, a power source is coupled with the plates 102 with the help of electric connections 108. The power source is configured to provide alternating or direct current to the plates 102. The flexible wall 104 may include an orifice 106 on the perimeter of the wall. The flexible wall 104 may be formed from a metal, plastic, glass, ceramic, or elastomeric material. Suitable metals include materials such as nickel, aluminum, copper and molybdenum, or alloys such as stainless steel, brass, bronze and the like. Suitable elastomeric material includes silicones, rubbers, urethanes, and the like. The plates 102 and the wall 104 may be adhered to each other with the help of suitable adhesives, or solders, or other fixing mechanisms.

When actuation signals are provided to the actuators on the plates 102, the plates 102 expand causing the volume in the housing to increase. With an increase in the volume of the housing, fluid enters the fluid housing through the orifice 106. In embodiments where piezoelectric material bonded to a rigid disc is used, the expansion of the piezoelectric material causes the rigid disc to deform into a dome shape thereby causing the volume of the housing to increase. In embodiments when the power source provides DC electric signals, the plates 102 return to their original positions when the electric signals are disconnected leading to a reduction in volume of the fluid housing. In certain embodiments, when alternating electric signals are provided by the power source, the plates 102 are displaced in an opposite direction thereby causing a further reduction in volume of the fluid housing. When the volume in the fluid housing is reduced, a jet of fluid escapes the orifice 106. The cooling system 100 is placed such that the jet of fluid escaping from the orifice 106 is directed towards the heat generating element of the device. Through convection, the jet of fluid reduces the temperature of the heat generating element of the device. The process of applying electric signals to the actuators on the plates 102 may be repeated periodically to reduce temperature of the heat generating elements. Control systems are also employed to control the application of electric signals to the plates 102. To reduce the temperature of multiple heat generating elements of the device, multiple cooling systems 100 may be placed in a housing that holds the device. The volume of fluid that enters and escapes the orifice 106 depends on the displacement of the plates 102 caused by the actuators. To achieve more displacement, actuators such as hydraulic actuators, and magnetic actuators can be used. However, they add significantly to the size and weight of the cooling system 100. Cooling system 100 thus primarily uses piezoelectric material for actuation. However, the amount of displacement of plates 102 caused by the piezoelectric materials is only in the range of a few microns. Embodiments described in conjunction with FIGS. 2, 3, 4, 5, 6, 7, and 8 help in achieving more displacement of the plates without adding significantly to the size and weight of the cooling system 100.

Figure 2:
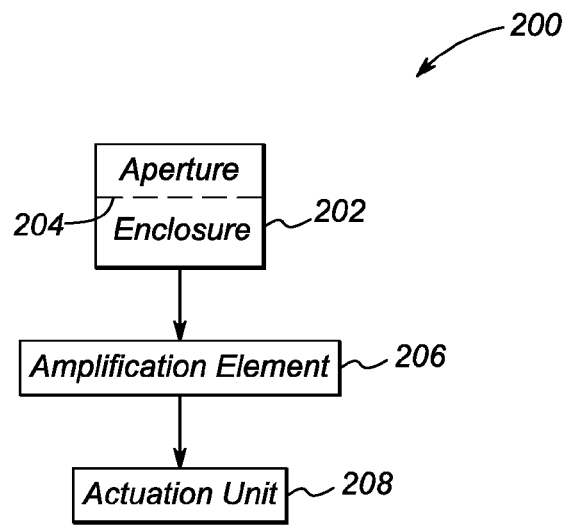
FIG. 2 illustrates a block diagram of a cooling system according to various embodiments of the present invention.

FIG. 2 illustrates a block diagram of a cooling system 200 according to various embodiments of the present invention. The cooling system 200 includes an enclosure 202 that includes at least one aperture 204. Further, the cooling system includes an amplification element 206, and an actuation unit 208. The enclosure 202 is configured to act as a fluid housing that stores the fluid entering through the aperture 204. The enclosure 202 includes walls such that the fluid housing is covered from all sides allowing fluid entry and exit in the fluid housing only through the aperture 204. According to certain embodiments, the enclosure 202 may include four walls that may be made of flexible material such as elastomeric material. Examples of elastomeric materials include silicones, rubbers, urethanes, and the like. In certain other embodiments, the side and bottom walls of the enclosure 202 may be defined by a cap-like casing that has cylindrical side walls, and a bottom plate, a plate may be adhered to the casing on a top portion to seal the casing from all sides. The plate on top may have an aperture 204 that allows for fluid entry and exit into the enclosure 202. The enclosure 202 may also be defined by a plate acting as a top wall, the actuation unit 208 acting as the bottom wall, and the amplification element 206 acting as the side walls. Further, the enclosure 202 may also be defined by a plate acting as a top wall, the actuation unit 208 acting as the bottom wall, and side walls defined by a rigid material. The movable wall of the enclosure 202 that is coupled to the amplification element 206 acts as a mass component. These and other configurations of the enclosure define the configurations of the cooling system illustrated in FIGS. 3, 4, 5, 6, and 7.

In the cooling system 200, the amplification element 206 is sandwiched between the actuation unit 208, and at least one wall of the enclosure 202. According to certain embodiments, the amplification element 206 is an elastic member. Examples of elastic members include, but are not limited to, linear springs, X-springs, curved elastic elements, leaf springs, or any other component that displays elastic properties. The actuation unit 208 is configured to cause displacement in the enclosure 202. The actuation unit 208, in certain embodiments, includes an actuator. According to certain embodiments, the actuator from the actuation unit 208 may be a linear actuator. Examples of linear actuators include hydraulic actuators, pneumatic actuators, piezoelectric actuators, moving-coil actuators, and electro-mechanical actuators. The actuation unit 208 may further include a rigid plate that is fixed with the actuator. The actuator and the rigid plate may be adhered to each other with the help of suitable adhesives, or solders, or other fixing mechanisms to form the actuation unit 208. In certain embodiments, the actuation unit 208 may include a piezoelectric disc that is coupled with a power source. In certain other embodiments, components including piezoelectric material, such as rectangular piezoelectric plate, piezoelectric beam, and the like, may be used to define the actuation unit 208. The piezoelectric component in such embodiment may act as the actuator as well as the rigid plate. In certain other embodiments, the actuation unit 208 may include piezoelectric material adhered to a rigid plate. In embodiments, wherein the actuation unit 208 includes piezoelectric material, the piezoelectric material is connected to a power source that supplies actuation signals. The amplification element 206 may be formed by stacking a plurality of actuation units 208 in a series fashion. In the cooling system 200, the enclosure 202 is mechanically coupled with the amplification element 206. The amplification element 206 is in turn coupled to the actuation unit 208. In certain embodiments, one or more walls of the enclosure 202 may also be made from piezoelectric material. In such embodiments, when the walls of the enclosure 202 are connected to a power source, electric signals are provided to the walls of the enclosure 202 and displacement is caused. The displacement caused by the walls of the enclosure 202 by itself, is further enhanced by application of actuation signals to the actuation unit 208.

When actuation signals are applied to the actuation unit 208, the actuation unit 208 is displaced from its original position. For example, when the actuation unit 208 is a piezoelectric actuator disc, an electric signal is supplied from a power source that is electrically coupled with the piezoelectric actuator disc. Upon application of the electric signal, the piezoelectric disc moves from its original position to displace at least one wall of the enclosure 202 away from the remaining elements of the cooling system 200 and increase the volume of the enclosure 202. In this case, the actuation unit 208 drives the displacement of the amplification element 206. The amplification element 206, in turn, leads to a displacement of that wall of the enclosure 202 that is coupled with the amplification element 206. The amplification element 206 thus amplifies movement of the wall of the enclosure 202 caused by the movement of the actuation unit 208. When the volume of the enclosure 202 increases, fluid enters from the aperture 204 into the enclosure 202. When the actuation signal is disconnected from the actuation unit 208, or when the polarity of the actuation signal to the actuation unit 208 is reversed, the wall of the enclosure 202 returns to its original position, or is displaced towards the remaining elements of the cooling system 200, thereby reducing the volume of the enclosure 202. When volume of the enclosure 202 is reduced, the fluid escapes the enclosure 202 from the aperture 204. The cooling system 200 is placed in order to direct the fluid escaping from the aperture 204 to be directed towards a heat generating element that is proximate to the cooling system 200.

Figure 3:
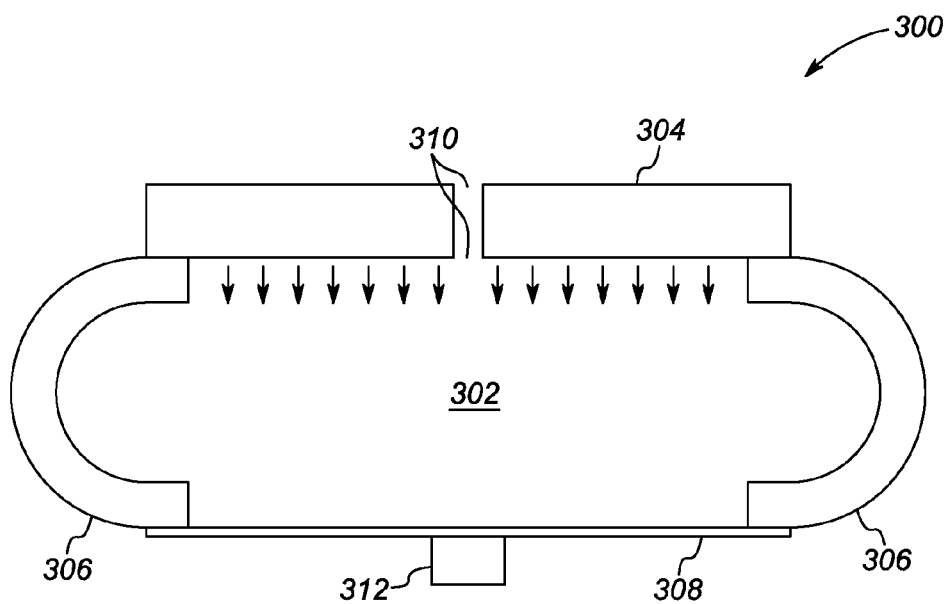
FIG. 3 illustrates a configuration of the cooling system according to one embodiment of the present invention.

FIG. 3 illustrates a cross-section of a cooling system 300 according to one embodiment of the present invention. In the embodiment illustrated in FIG. 3, the walls of the enclosure 302 are defined by a plate 304, amplification elements 306, and an actuation unit 308. At least one wall of the enclosure 302 is movable. In the illustrated embodiment, the plate 304 is the movable wall of the enclosure 302. The cooling system 300 further includes an aperture 310, and a support fixture 312. The plate 304 includes the aperture 310.

The actuation unit 308 is configured to cause displacement in at least one wall of the enclosure 302. In the embodiment illustrated in FIG. 3, the actuation unit 308 is configured to displace the plate 304 from its original position. The actuation unit 308, in certain embodiments, includes a linear actuator. Examples of linear actuators include hydraulic actuators, pneumatic actuators, piezoelectric actuators, moving-coil actuators, and electro-mechanical actuators, and electro-resistive polymers. In certain embodiments, the actuation unit 308 may further include a second plate that is fixed with a linear actuator. The linear actuator and the second plate may be adhered to each other with the help of suitable adhesives, or solders, or other fixing mechanisms to form the actuation unit 308. In certain embodiments, the actuation unit 308 may include a piezoelectric disc that is coupled with a power source. In certain other embodiments, the actuation unit may include piezoelectric material adhered to a rigid disc. The piezoelectric material is connected to a power source that supplies actuation signals. The actuation unit 308 is mechanically coupled with the amplification element 306. Examples of amplification element 306 include, but are not limited to, linear springs, elastic elements, or any material that displays elastic properties.

In the illustrated embodiment, the amplification element 306 includes a pair of curved elastic elements. The curved elastic elements, according to certain embodiments, may be made of flexible material such as silicone, or rubber. The amplification element 306, along with flexible material along the periphery of the plate 304, may also define the side walls of the enclosure 302, according to certain embodiments. Further, the amplification element 306 is also coupled with the plate 304 of the enclosure 302. The amplification element 306 and the plates 304 are loosely coupled to ensure that the plate 304 can be displaced from its original position when the amplification element 306 experiences movement.

In one embodiment, to achieve maximum operational efficiency, actuation signals are supplied at a frequency that is equivalent to a resonant frequency of a combination of the actuation unit 308 and the amplification elements 306. The resonant frequency of the cooling system 300 having a single moving element can be calculated using equation 1.

$$\omega = \sqrt{\frac{k}{m}} \quad (1)$$

In equation 1, ω is the resonant frequency of the cooling system 300, k is the stiffness of the moving element, and m is the mass of the moving element. When the cooling system 300 includes more than one moving element, as is the case in the embodiment described in conjunction with FIG. 3, the resonant frequency is dependent on the stiffness of each moving element, and mass of each moving element. In the cooling system 300 of FIG. 3, the moving elements include the plate 304, the actuation unit 308, and the amplification element 306. To reduce the resonant frequency of the cooling system 300, as seen from equation 1, the stiffness of the cooling system 300 needs to be reduced. In certain embodiments, the stiffness of the cooling system 300 may be reduced by selecting amplification element 306 based on its stiffness. In one embodiment, the amplification element 306 is selected such that the resonant frequency of the cooling system 300 is maintained at approximately 60 Hz. In other embodiments, to reduce the resonant frequency, a mass component is added to the moving elements of the cooling system 300. The mass component is selected such that the resonant frequency of the cooling system 300 is reduced to a desired level. In certain embodiments, the mass component is added as a layer that is adhered to the amplification element 306. In certain other embodiments, the mass component is added as a blob of mass that is externally fixed with the amplification element 306.

When actuation signals are applied to the actuation unit 308, the actuation unit 308 is displaced from its original position. For example, when the actuation unit 308 is a piezoelectric actuator disc, an electric signal is supplied from a power source that is electrically coupled with the piezoelectric actuator disc. Upon application of the electric signal, the piezoelectric disc moves from its original position to cause the amplification element 306 to experience movement. The movement in the amplification element 306, in turn, displaces the plate 304 away from the remaining elements of the cooling system 300 and increases the volume of the enclosure 302. The amplification elements 306 thus amplify movement of the plate 302 caused by the movement of the actuation unit 308. When the volume of the enclosure 302 increases, fluid enters from the aperture 310 into the enclosure 302. When actuation signal is disconnected from the actuation unit 308, or when the polarity of the actuation signal to the actuation unit 308 is reversed, the plate 304 returns to its original position, or is displaced towards the remaining elements of the cooling system 300, thereby reducing the volume of the enclosure 302. When volume of the enclosure 302 is reduced, the fluid escapes the fluid housing from the aperture 310. The cooling system 300 is placed in order to direct the fluid escaping from the aperture 310 to be directed towards a heat generating element that is proximate to the cooling system 300. In the illustrated embodiment, the fluid escapes in a direction that is opposite and parallel to the direction of movement of the plate 304.

The support fixture 312 is placed beneath the actuation unit 308 to provide a fixed base to the cooling system 300. The support fixture 312, according to certain embodiments, is made from epoxy material. In certain other embodiments, the support fixture 312 is made from silicone. The support fixture 312 may be further fixed with a device housing that holds the device that is being cooled by the cooling system 300. The device housing, according to certain embodiments, may be a candelabra fixture that holds a lighting system.

Figure 4:
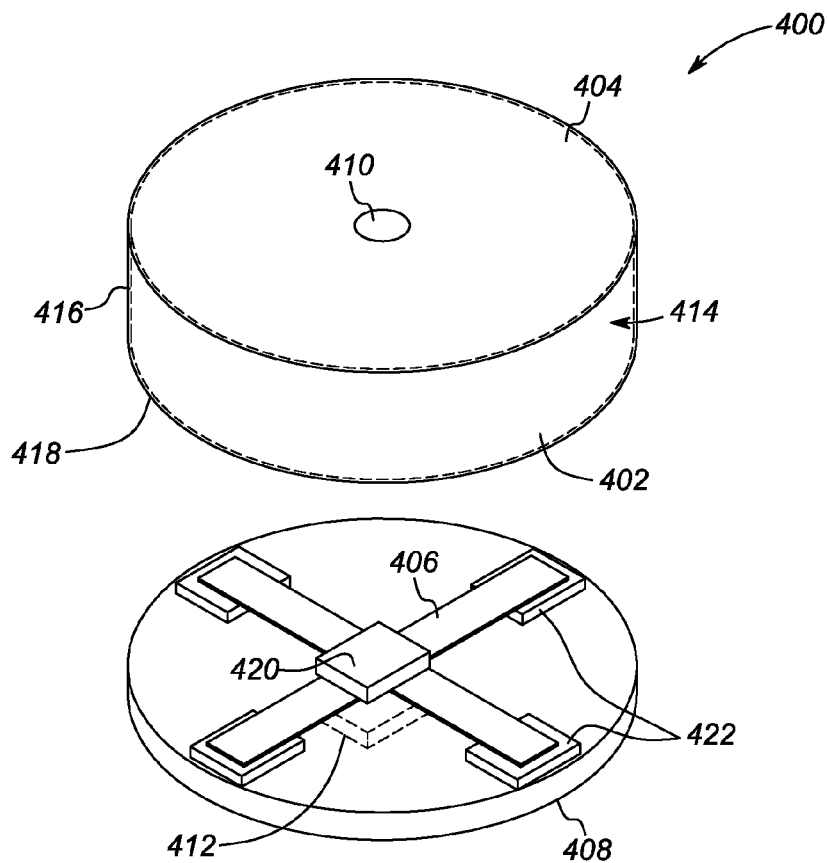
FIG. 4 illustrates a configuration of the cooling system according to another embodiment of the present invention.

FIG. 4 illustrates a configuration of the cooling system 400 according to another embodiment of the present invention. The cooling system 400 includes an enclosure 402, a plate 404, an amplification element 406, an actuation unit 408, an aperture 410, and a plurality of support fixtures 412. In the embodiment illustrated in FIG. 4, the walls of the enclosure 402 of the cooling system 400 may be defined by a casing 414 that is sealed from three sides. The top wall of the enclosure 402, according to the illustrated embodiment, is defined by the plate 404, while the side and bottom walls 416 and 418 are defined by the casing 414 itself. The enclosure 402, according to certain embodiments, is made from materials exhibiting elastic properties. Examples of materials used to make the casing 414 include silicone, rubber, and the like. The plate 404, according to certain embodiments, is made from rigid material. Further, the plate 404 includes the aperture 410. In the illustrated embodiment, the plate 404 is adhered to a periphery of the side walls of the enclosure 402. The plate 404 provides that the top surface of the enclosure 402 does not experience any displacement when actuation signals are provided to the actuation unit 408.

Further, in the illustrated embodiment, the amplification element 406 is mechanically coupled with the bottom wall 418 of the enclosure 402. The amplification element 406, according to certain embodiments, is an elastic member. The amplification element 406, in the illustrated embodiment is an X-spring. In the illustrated embodiment, the amplification element 406 is an "X" shaped spring with a flat surface that is configured to cause linear motion in a direction perpendicular to the surface of the spring. In certain embodiments, the amplification element 406 and the bottom wall 418 of the enclosure 402 are adhered to each other with the aid of one of the plurality of support fixtures 412. The support fixtures 412, according to certain embodiments, are made from elastic material. According to the embodiment illustrated in FIG. 4, a central node 420 of the X-spring amplification element 406 is coupled with the enclosure 402. The side nodes 422 of the X-spring amplification element 406 are mechanically coupled with the actuation unit 408. The actuation unit 408, according to certain embodiments, includes a linear actuator. Examples of linear actuators include, but are not limited to, hydraulic actuators, electromechanical actuators, piezoelectric actuators, piezo-resistive polymers, and the like. The actuation unit 408, according to one embodiment may be a disc made of piezoelectric material. The disc is then connected to a power source to provide actuation signals to the actuation unit 408. According to certain other embodiments, the actuation unit 408 includes a piezoelectric disc attached to a rigid plate.

When actuation signals are provided to the actuation unit 408, the actuation unit 408 experiences displacement. The displacement of the actuation unit 408 leads to contraction of the amplification element 406. Due to the coupling of the amplification element 406 and the bottom wall of enclosure 402, the contraction of the amplification element 406 leads to an increase in volume of the enclosure 402. The increase in volume of the enclosure 402 allows for fluid to enter the enclosure 402. When the actuation signal is discontinued or when the polarity of the actuation signal is reversed, the bottom wall of the enclosure 402 either returns to its original position or moves closer to the top wall of the enclosure 402 thereby reducing the volume for the fluid in the enclosure 402. The reduction in volume leads to a jet of fluid escaping from the aperture 410 on the plate 404. The cooling system 400 is placed such that the jet of fluid escaping from the aperture 410 is directed towards a heat generating element of the device in which the cooling system 400 is installed.

Figure 5:
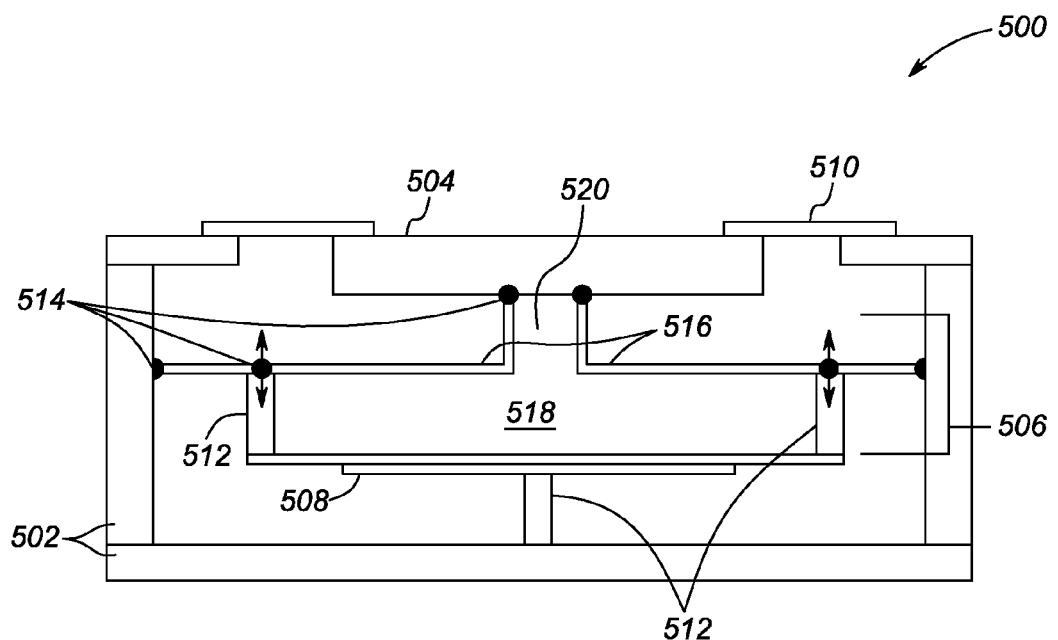
FIG. 5 illustrates a configuration of the cooling system according to yet another embodiment of the present invention.

FIG. 5 illustrates a configuration of a cooling system 500 according to yet another embodiment of the present invention. The cooling system 500 includes a device housing 502, a plate 504, amplification element 506, actuation unit 508, seals 510, and a plurality of support fixtures 512, and aperture 520. The amplification element 506 illustrated in the FIG. 5 includes a plurality of hinges 514, and a plurality of arms 516. The plurality of hinges 514 are mechanically coupled with either the device housing 502, or the plate 504 such that the plurality of arms 516 operate in a lever-like fashion with one end fixed by the plurality of hinges 514 and the other end free to move independent of the housing 502 and the plate 504. In the cooling system 500, the actuation unit 508 is coupled with the device housing 502 with the help of at least one of the support fixtures 512. Further, the plurality of arms 516 are coupled with the actuation unit 508 with the help of the plurality of support fixtures 512. In the cooling system 500, the plurality of arms 516, the plate 504, the seals 510, and the actuation unit 508 define an enclosure 518. The enclosure 518 also includes the plate 504 in such a way that the aperture 520 provides for an entry and exit of fluid into the enclosure 518. Further, the seals 510, according to one embodiment, are made from elastic material such as silicone, rubber, and the like. The actuation unit 508 may further include a rigid plate that is fixed with a linear actuator, such as a piezoelectric actuator. The linear actuator and the rigid plate may be adhered to each other with the help of suitable adhesives, or solders, or other fixing mechanisms to form the actuation unit 508. In certain embodiments, the actuation unit 508 may include a piezoelectric disc that is coupled with a power source. The piezoelectric disc in such embodiment may act as the actuator as well as the rigid plate. When actuation signals are provided to the actuation unit 508, the actuation unit 508 experiences displacement. Due to the coupling between the plurality of arms 516 and the actuation unit 508 with the help of support fixtures 512, the plurality of arms 516 experience movement. The plurality of arms 516 being fixed on one end with the help of the plurality of hinges 514 display a lever-like movement when the actuation unit 508 is actuated. The plurality of arms 516 thus amplify the movement caused by the actuation unit 508 and lead to an amplified displacement of the plate 504. When the plate 504 moves from its original position, without losing its coupling with the device housing 502 due to the seals 510, fluid enters from the aperture 520 into the enclosure 518. When the actuation signals to the actuation unit 508 are disconnected, or when the polarity of the actuation signals are reversed, the plate 504 either returns to its original position or closer towards the actuation unit 508. This movement leads to a reduction in volume of the enclosure 518. The reduction in volume of the enclosure 518 causes excess fluid from the enclosure 518 to exit from the aperture 510. The fluid exiting from the aperture 510 is directed towards a heat generating element of the device being cooled by the cooling system 500.

Figure 6:
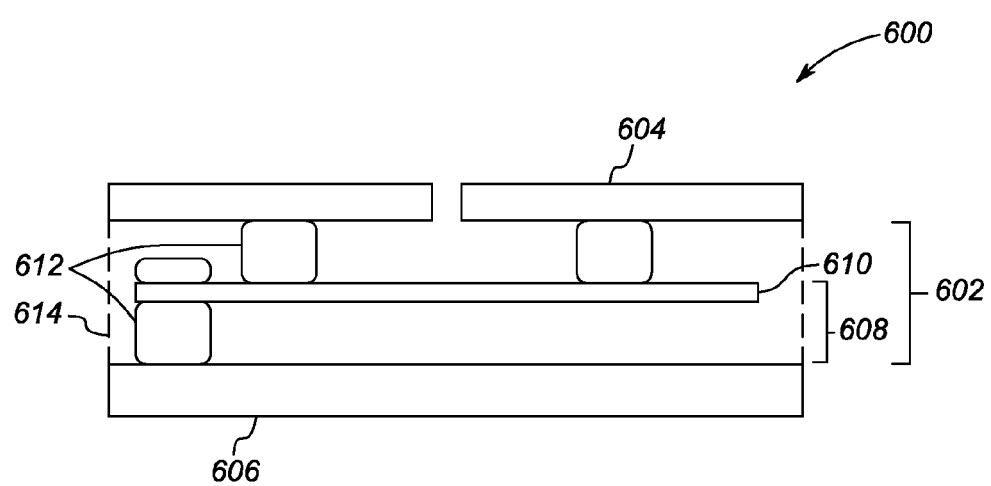
FIG. 6 illustrates configuration of the cooling system according to another embodiment of the present invention.

FIG. 6 illustrates a configuration of cooling system 600 according to one embodiment of the present invention. The cooling system 600 includes an enclosure 602. Top and bottom walls of the enclosure 602 are defined by a plate 604, and an actuation unit 606. Side walls 614 of the enclosure 602 may be defined by membranes that are coupled to the plate 604 on one end and the actuation unit 606 on the other. The amplification element 608 is placed between the actuation unit 606 and the plate 604 to amplify the movement of the plate 604. In the illustrated embodiment, the amplification element 608 is a single piezoelectric beam 610. The single piezoelectric beam 610 is placed on the actuation unit 606 and supports the plate 604 on its top surface. The piezoelectric beam 610 and the actuation unit 606 are separated with a flexible support fixture 612. The piezoelectric beam 610, the actuation unit 606, and the flexible fixture 612 are fixed with known adhesive means. The piezoelectric beam 610 and the plate 604 are separated from each other with support fixtures 612. The support fixtures 612 separating the plate 604 and the piezoelectric beam 610 are selected such that the displacement of the plate 604 caused by the piezoelectric beam 610 is parallel to a base of the cooling system 600.

Figure 7:
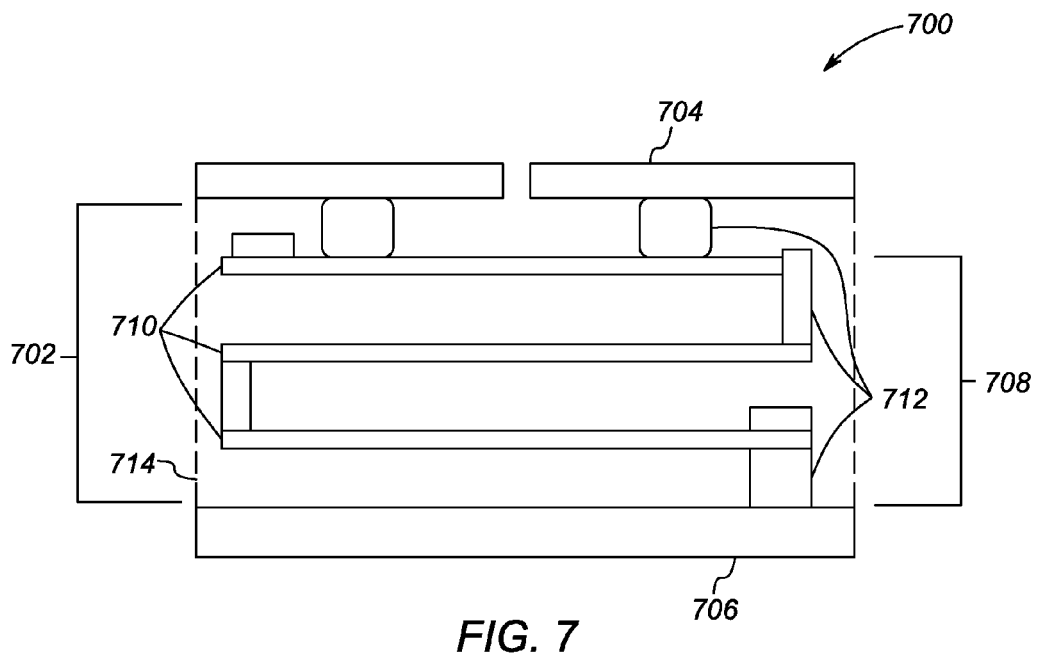
FIG. 7 illustrates a configuration of a cooling system according to yet another embodiment of the present invention.

FIG. 7 illustrates a configuration of cooling system 700 according to one embodiment of the present invention. The cooling system 700 includes an enclosure 702. Top and bottom walls of the enclosure 702 are defined by a plate 704, and an actuation unit 706. Side walls 714 of the enclosure 702 may be defined by membranes that are coupled to the plate 704 on one end and the actuation unit 706 on the other. The amplification element 708 is placed between the actuation unit 706 and the plate 704 to amplify the movement of the plate 704. In the illustrated embodiment, the amplification element 708 includes a plurality of piezoelectric beams 710. The piezoelectric beams 710 are stacked over each other, and separated from one another by support fixtures 712. The stack of piezoelectric beams 710 is placed on the actuation unit 706 and supports the plate 704 on its top surface. The piezoelectric beams 710 and the actuation unit 706 are separated with flexible support fixture 712. The piezoelectric beams 710, the actuation unit 706, and the support fixture 712 are fixed with known adhesive means. The piezoelectric beams 710 and the plate 704 are separated from each other with support fixtures 712. The support fixtures 712 separating the plate 704 and the piezoelectric beams 712 are selected such that the displacement of the plate 704 caused by the piezoelectric beam 712 is parallel to a base of the cooling system 700.

The amplification elements 608 and 708 formed from piezoelectric beams 610 and 710, as illustrated in FIGS. 6 and 7, respectively, are actuated with an electric signal to cause displacement. The power source that supplies the actuating electric signal is connected to the piezoelectric beams 610 and 710 through electric connections that are connected with the beams 610 and 710 through apertures made in the actuation unit 606 and 706. The apertures are made such that the fluid housing remains sealed from all sides while allowing for electric connections to be established.

When the actuation unit 606 and 706 is actuated, actuating electric signals are provided to the piezoelectric beams 610 and 710. According to certain embodiments, the electric signals are provided to the each of the piezoelectric beams 710 from the same power source. However, depending on the amount of amplification desired, piezoelectric beams 710 may be selected such that each one of them displays different displacements for different applied voltages. The actuating electric signals cause displacement of the actuation unit 606 and 706. When electric signals are provided to the piezoelectric beams 610 and 710 the beams are also displaced. The displacement of the beams 610 and 710 is further enhanced by the additive displacement of the actuation unit 606 and 706. The displacement caused by the actuation unit 606 and 706 and the displacement of the beams 610 and 710 cause the plates 604 and 704 to displace. This displacement of the plates 604 and 704 is amplified in comparison with a cooling system such as the cooling system 100 lacking the amplification elements 608 and 708.

Figure 8:
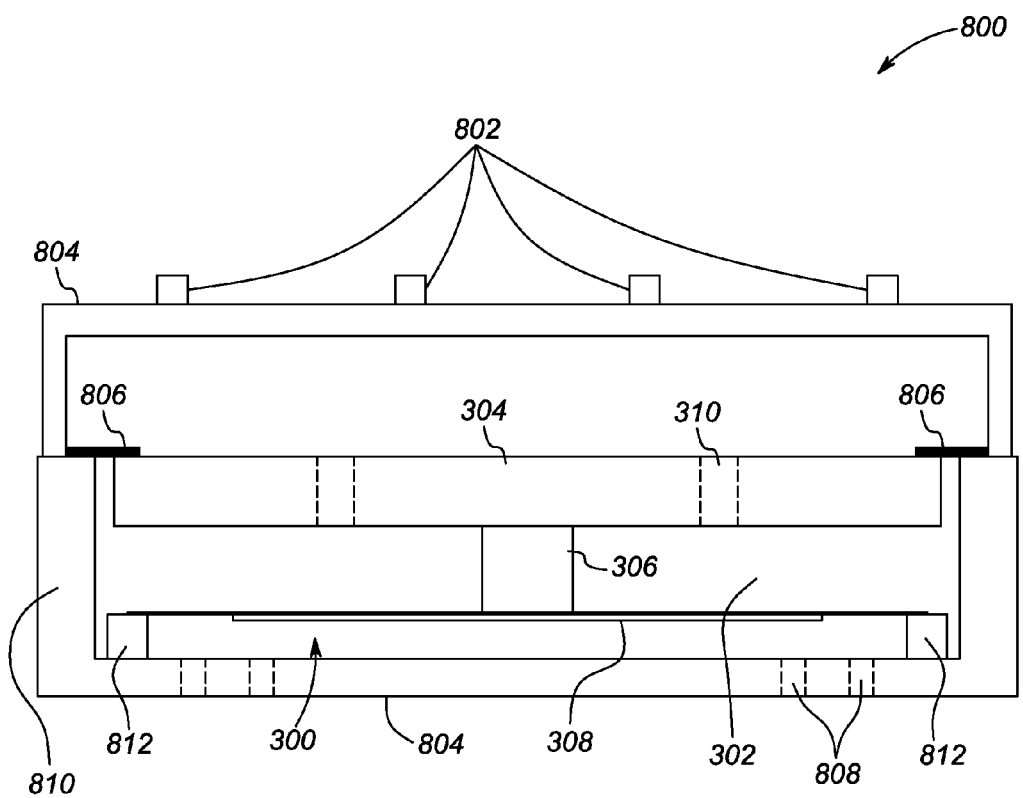
FIG. 8 illustrates a lighting system according to one embodiment of the present invention.

FIG. 8 illustrates a lighting system 800 according to one embodiment of the present invention. The lighting system 800 includes a light source 802, a device housing 804, flexible membranes 806, and the cooling system 300. The device housing 804 is configured to provide support to the light source 802 and provide means to establish electric connections of the light source 802 with a power source. The light source 802 is configured to emit light when electricity is applied. The light source 802, according to certain embodiments, may be one or more light emitting diodes (LEDs). The light source 802 includes heat generating elements that generates heat when the light source is in operation. Examples of heat generating elements include, but are not limited to, material or components used to manufacture the LEDs, or enclosures around incandescent lamps that are heated by the infrared radiation (IR) from the lamp. The cooling system 300 is disposed in the device housing 804 to cool the heat generating elements. The cooling system 300 is coupled with the device housing 804 with the help of flexible membranes 806. The flexible membranes 806, according to certain embodiments, may be made of flexible materials such as silicone. The flexible membranes 806 are coupled with the plate 304 and side walls 810 of the device housing 804. Further, the device housing 804, the plate 304, and the flexible membranes 806 define walls of the enclosure 302.

The cooling system 300 further includes actuation unit 308, amplification element 306, and apertures 310 that are made within the plate 304. The amplification element 306, as shown in FIG. 8, is a linear spring. According to certain embodiments, the amplification element 306 may also be a pair of curved walls that are sandwiched between the plate 304, and the actuation unit 308 on peripheral ends. The amplification element 306 may also be an X-spring, or a leaf spring, or any other known component with low spring stiffness. The actuation unit 308 is fixed with the device housing 804 with fixtures 812 that provide for a fixed base to the cooling system 300. In certain embodiments, the actuation unit 308 may be a piezoelectric disc. In certain other embodiments, the actuation unit 308 may include an actuator that is coupled with a passive plate. The actuation unit 308 is connected with a power source that provides for the actuation signal to cause displacement of the actuation unit 308. The displacement of the actuation unit 308 leads to displacement of the amplification element 306, which in turn causes displacement of the plate 304. The movement of the plate 304 away from the device housing 804 leads to an increase in the volume of the enclosure 302. The increase in volume leads to entry of fluid, for example, ambient air, in the enclosure 302 through the apertures 310. When the actuation signal is disconnected, the actuation unit 308, and the plate 304 return to the original position thereby reducing volume of the enclosure 302. The reduction in volume causes the fluid to escape from the apertures 310. The fluid is directed to the heat generating element of the light source 802 to cool the light source 802. According to certain embodiments, a plurality of openings 808 are made to a bottom surface of the device housing 804 to avoid dampening issues of the actuation unit 308. According to certain embodiments, the flexible membranes 806 also contribute to amplification of displacement of the plate 304. The flexible membranes 806 are made from materials that have spring stiffness such that the displacement of the piezoelectric actuation unit 308 causes the flexible membranes 806 to be stretched and leads to amplification of the displacement of the plate 304 that follows.

The amplification elements 306 thus lead to an amplification of displacement of the plate 304 and thus lead to an increase in influx and outflow of fluid in the enclosure 302. The increase in volume of fluid from the enclosure 302 leads to faster cooling of the heat generating elements.

Various embodiments described above thus provide for a system for cooling devices. The above-described embodiments of the system provide for a faster solution to cool heat generating elements in devices. The use of amplification element leads to an increase in displacement of at least one wall in the cooling system, thus leading to greater volume of fluid entering and leaving the enclosure. This increase in volume leads to faster cooling of the heat generating elements. Further, in the system for cooling devices the amplification elements are selected such that the operating frequency of the cooling system is approximately at main line frequency and voltage (i.e. 120V supplied at a frequency of 60 Hz in the United States). Thus, power from residential AC power sockets can be directly supplied to the actuation unit to cause movement of the wall of the enclosure. This reduces the expense of utilizing power electronics required in earlier cooling systems to convert power from AC power sockets to the required power at 100 Hz frequency. Further, in the certain embodiments of the cooling system, the apertures are made on that wall of the enclosure that experiences displacement. Due to such a movement, approximately 100 percent of fluid under the wall is displaced and exits the fluid and increases the cooling performance of the cooling system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable any person of ordinary skill in the art to practice the embodiments of invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described system for cooling devices, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A cooling system comprising:
   an enclosure defined by an actuation unit, a movable plate positioned opposite the actuation unit, and at least one side wall coupling the activation unit to the movable plate, wherein the movable plate is movable in a first direction and comprises at least one aperture; and
   an amplification element positioned within the enclosure and mechanically coupled with the moveable plate and the actuation unit;
   wherein the actuation unit comprises at least one actuation signal triggered actuator to cause a linear displacement of the amplification element in the first direction, and wherein the amplification element is configured to amplify the actuation signal triggered actuator displacement through to the movable plate of the enclosure to cause entry and exit of fluid in the first direction from the aperture.

2. The cooling system as recited in claim 1, wherein the actuation signal triggered actuator comprises a component comprising piezoelectric material.

3. The cooling system as recited in claim 1, wherein the actuation signal triggered actuator is mechanically coupled with a rigid plate.

4. The cooling system as recited in claim 2, wherein the component comprising piezoelectric material comprises a piezoelectric disc.

5. The cooling system as recited in claim 1, wherein the amplification element comprises a linear spring and a mass component.

6. The cooling system as recited in claim 1, wherein the at least one side wall comprises a curved elastic element.

7. The cooling system as recited in claim 6, wherein the curved elastic element comprises silicone.

8. The cooling system as recited in claim 1, wherein the amplification element comprises a leaf spring.

9. The cooling system as recited in claim 1, wherein the amplification element comprises a plurality of piezoelectric beams.

10. The cooling system as recited in claim 1, wherein the amplification element comprises an X-spring having a central node coupled to the enclosure.

11. The cooling system as recited in claim 1, wherein the amplification element comprises a flexible support structure.

12. The cooling system as recited in claim 1, wherein the cooling system is disposed in a device housing of a device being cooled.

13. The cooling system as recited in claim 9, wherein the plurality of piezoelectric beams are separated by at least one flexible support fixture.

14. The cooling system as recited in claim 9, wherein the plurality of piezoelectric beams are configured to exhibit additive displacement when actuated.

15. The cooling system as recited in claim 1, wherein the amplification element comprises a plurality of hinges that couple a plurality of lever arms with the movable plate and the actuation unit.

16. A lighting system comprising:
   a light source, wherein the light source comprises a heat generating element; and
   a cooling system disposed proximate to the heat generating element, wherein the cooling system comprises
   an enclosure defined by an actuation unit, a movable plate positioned opposite the actuation unit, and at least one side wall coupling the activation unit to the movable plate, wherein the moveable plate is movable in a first direction and comprises at least one aperture; and
   an amplification element positioned within the enclosure and mechanically coupled with the moveable plate and the actuation unit;
   wherein the actuation unit comprises at least one actuation signal triggered actuator to cause a linear displacement of the amplification element in the first direction, and wherein the amplification element is configured to amplify the actuation signal triggered actuator displacement through to the movable plate of the enclosure to cause entry and exit of fluid in the first direction from the aperture.

17. A cooling system comprising:
   an enclosure, wherein the enclosure comprises at least one movable wall movable in a first direction, and wherein the at least one movable wall of the enclosure comprises at least one aperture;
   an amplification element comprising an X-spring having a central node mechanically coupled with at least one movable wall of the enclosure; and
   an actuation unit mechanically coupled with the amplification element, wherein the actuation unit comprises at least one actuation signal triggered actuator to cause a linear displacement of the amplification element in the first direction, and wherein the amplification element is configured to amplify the actuation signal triggered actuator displacement through to the at least one movable wall of the enclosure to cause entry and exit of fluid in the first direction from the at least one aperture in the enclosure.

* * * * *